United States Patent [19]
Zollinger

[11] 3,980,044
[45] Sept. 14, 1976

[54] APPARATUS FOR DEPOSITING THIN COATS BY VAPORIZATION UNDER THE SIMULTANEOUS ACTION OF AN IONIZED GAS

[75] Inventor: Erich Zollinger, Schaanwald, Liechtenstein

[73] Assignee: Balzers Patent und Beteiligungs AG, Liechtenstein

[22] Filed: Feb. 24, 1975

[21] Appl. No.: 552,215

Related U.S. Application Data
[63] Continuation of Ser. No. 335,089, Feb. 23, 1973, abandoned.

[30] Foreign Application Priority Data
Mar. 6, 1972   Switzerland.......................... 3275/72

[52] U.S. Cl. ............................................. 118/49.1
[51] Int. Cl.² ......................................... C23C 13/12
[58] Field of Search.......................... 118/49.1, 49.5; 427/39–41; 204/298

[56] References Cited
UNITED STATES PATENTS

| | | |
|---|---|---|
| 2,215,787 | 9/1940 | Hailer .......................... 118/49.5 UX |
| 2,820,722 | 1/1958 | Fletcher ................................ 427/38 |
| 3,208,873 | 9/1965 | Ames et al..................... 118/49.1 X |
| 3,528,387 | 9/1970 | Hamilton ........................... 118/49.1 |
| 3,733,258 | 5/1973 | Hanak et al. ................... 204/298 X |
| 3,748,169 | 7/1973 | Keller .................................... 427/39 |
| 3,750,623 | 8/1973 | Carpenter et al................. 118/49.5 |

*Primary Examiner*—Morris Kaplan
*Attorney, Agent, or Firm*—McGlew and Tuttle

[57] ABSTRACT

An apparatus for depositing thin coatings by vaporization onto substrates under the simultaneous action of an ionized gas comprises a gas chamber which is subdivided into first and second compartments which are connected to each other through a gas flow restrictor. The first compartment has a gas discharge electrode and has a connection to a supply line for the gas to be ionized. The second compartment contains a counterelectrode, an evaporator and means for holding the objects to be coated and is also connected to a pump to maintain a pressured gradient between the two compartments during vaporization.

4 Claims, 4 Drawing Figures

APPARATUS FOR DEPOSITING THIN COATS BY VAPORIZATION UNDER THE SIMULTANEOUS ACTION OF AN IONIZED GAS

This is a continuation of application Ser. No. 335,089 filed Feb. 23, 1973, now abandoned.

BACKGROUND OF THE INVENTION

1. Field of the Invention

This invention relates in general to coating devices and particularly to an apparatus for coating substrates by vaporization under the simultaneous action of an ionized gas.

2. Description of the Prior Art

A method for the production of thin coats is known which includes the vaporization of a substance in a vacuum vaporization plant in the presence of an atmosphere which reacts chemically with the substance. In such a method a coating is deposited on the objects to be coated which corresponds to the chemical compound resulting from the chemical reaction. This method is used mainly for the production of oxide films in the deposit of oxidizable substances in an oxygen atmosphere of low pressure. Coatings of other compounds, for example, nitrides, sulfides etc., can also be produced in the same manner. It is noteworthy that many coats which are obtained in this way are practically light absorption free. Considerable light absorption which is very undesirable for many applications must be accepted if such compounds are to be deposited by vaporization even though these compounds are themselves absorption-free. Experience has shown that this leads frequently to a partial decomposition of the evaporated compounds so that the deposits of other chemical compositions, for example in the vaporization of oxides and suboxides are formed.

It has already been suggested in the art to effect the reactive vaporization in an atmosphere which contains ions of the compound-forming gas. It is known to provide for this purpose a gas discharge vessel in the vaporization chamber having a wall with an opening through which the ionized gas can escape into the vaporization chamber.

In the last few years there has been an increasing demand for the production of coats which have a minimum absorption so that they may be exposed, for example, to light currents of maximum intensity such as are produced by lasers without being destroyed. These and other application possibilities had the result that more attention has been paid recently to the method of reactive vaporization in an ionized atmosphere. Even if maximum freedom of absorption is not of importance, the reactive vaporization in an ionized atmosphere is of interest for the industrial production of thin coats, because tests have shown that it is possible in this way to produce a hard and adhesive coat at a higher vaporization rate and with better vacuum than it was heretofore possible.

SUMMARY OF THE INVENTION

The present invention provides an arrangement for producing coatings by vaporization on substrates under the action of an ionized gas which makes it possible to effect a reactive vaporization in an ionized atmosphere with a much greater efficiency than heretofore. The invention provides a gas discharge chamber which is subdivided by a gas flow restrictor into two interconnected compartments with the first compartment containing a gas discharge electrode and being connected to a supply line for the gas to be ionized and the second compartment having a counterelectrode and an evaporator and means for holding the objects to be coated and also being connected to a vacuum pump in order to maintain a pressure gradient between the two compartments during vaporization.

Accordingly an object of the invention is to provide an apparatus for of coating substrates in an ionized gas atmosphere using a test apparatus having two chambers including a coating chamber having the article to be coated and having a counterelectrode in a receiving chamber having a gas discharge electrode and a connection to the gas to be ionized; comprising arranging the article to be coated in the coating chamber and evacuating the coating chamber to reduce the pressure therein and to create a pressure difference between the coating chamber and the receiving chamber, and directing a gas to be ionized from the receiving chamber to the coating chamber through a restricted orifice while applying a high voltage across the gas discharge electrode and the counterelectrode.

A further object of the invention is to provide an arrangement for depositing thin coats by vaporization on substances under the simultaneous action of an ionized gas which includes a gas discharge chamber which is subdivided into first and second compartments which are connected to each other through a gas flow restrictor, and wherein the first compartment has a gas discharge electrode, a connection to a supply line for the gas to be ionized and the second compartment includes a counterelectrode and evaporator and means for holding the objects to be coated, and which further includes a vacuum pump connected to the second compartment to maintain a pressure gradient between the two compartments during the vaporization.

A further object of the invention is to provide an apparatus for coating substrates which is simple in design, rugged in construction and economical to manufacture.

For an understanding of the principles of the invention, reference is made to the following description of typical embodiments thereof as illustrated in the accompanying drawing.

GENERAL DESCRIPTION OF THE PREFERRED EMBODIMENTS

Figure 1:
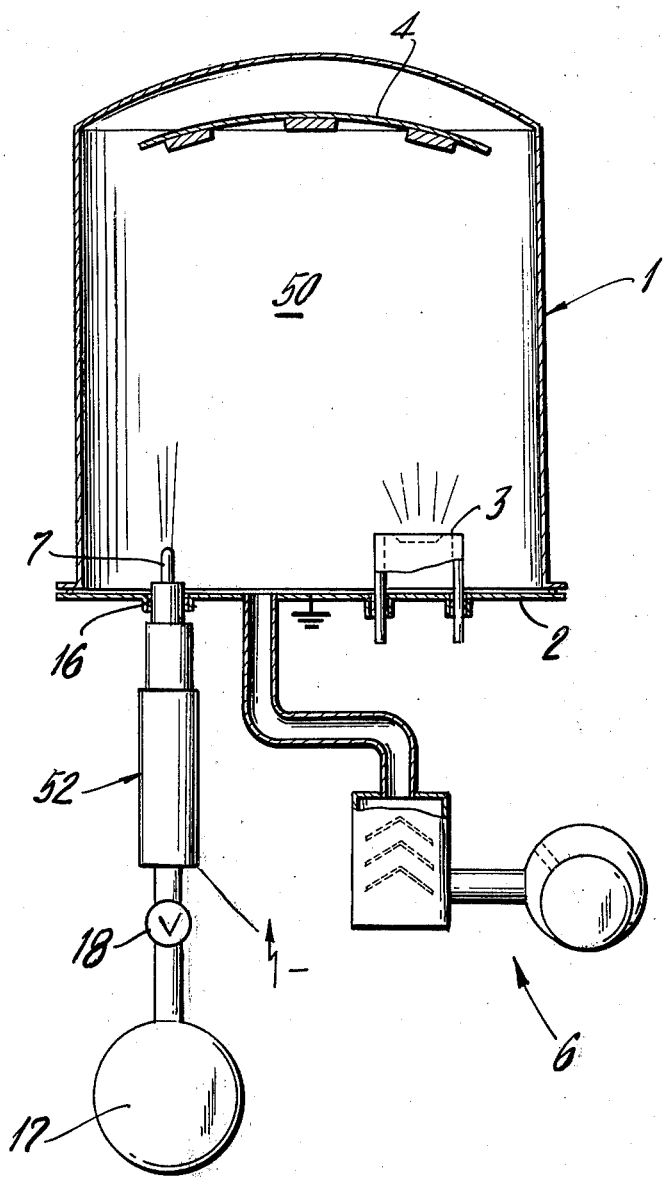
FIG. 1 is a schematic sectional view of a vapor depositing apparatus constructed in accordance with the invention.
Figure 2:
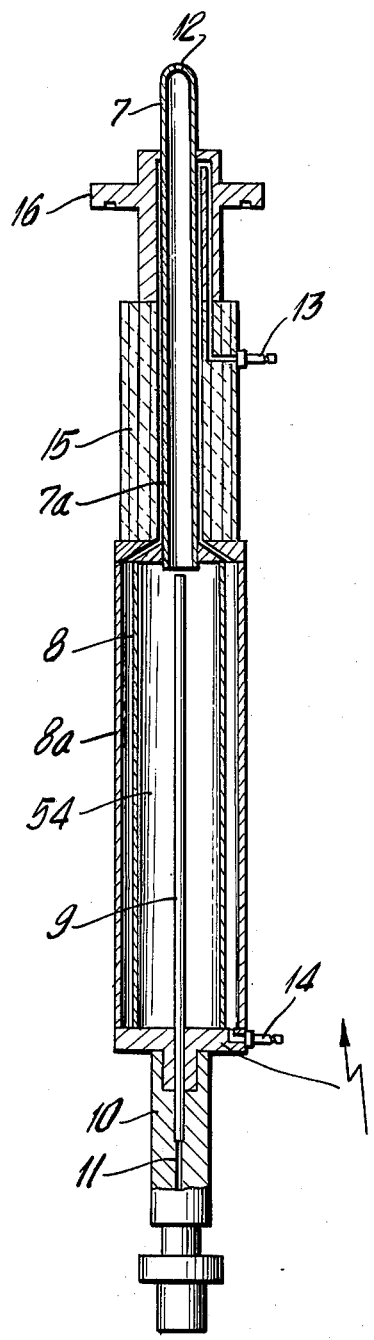
FIG. 2 is an enlarged sectional view of the receiving chamber shown in FIG. 1.
Figure 2A:
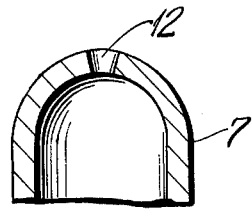
FIG. 2a is a further enlarged sectional view of the discharge tube between the two compartments.

Referring to the drawings in particular the invention embodied therein as shown in FIGS. 1,2 and 2a, comprises an apparatus for the depositing of thin coats onto substrates by vaporization under the simultaneous action of an ionized gas and which includes a housing or bell 1 which overlays a base plate 2 and which defines an interior first chamber or coating chamber 50. An evaporator 3 and holding means 4 for the objects 5 to be coated are arranged within the chamber 50. A vacuum pump and associated fittings generally designated 6 are connected to the chamber for the purpose of evacuating the chamber to reduce the pressure therein.

In accordance with the invention container means 52 generally designated define a second chamber or receiving chamber 54 which is connected to the first chamber 50 through a connecting line 7.

With the apparatus of the invention, a reactive vaporization of the articles 5 is carried out by evacuating the chamber 50 after the articles to be coated have been introduced therein and then filling it up with a reactive gas such as oxygen to a certain pressure usually about $10^{-4}$ Torr. Thereafter the evaporation of a substance which reacts with the gas is carried out by means of an evaporator 3 which is arranged over the base plate 2. In this manner a coating of the reaction product is deposited on the objects 5.

In order to be able to effect such a reactive vaporization in an ionized gas atmosphere, the ionized gas is supplied from a tank 17 through a valve 18 and into the chamber 54. The chamber 54 includes an antechamber portion 8 which contains an axially arranged tubular high voltage electrode 9. The discharge tube 7 includes an inwardly extending portion 7a which connects into the antechamber 8. The whole discharge tube 7 and the walls of the antechamber 8 can comprise, for example, quartz or aluminum oxide. The container means 52 also includes a bottom part 10 which terminates the bottom of the antechamber 8 and which is designed as a voltage supply and holding means for the rod electrode 9 and also as a gas inlet into the antechamber 8. For this purpose a bore 11 extends through the tubular rod 9 and continues through the bottom part 10. The gas necessary for the reactive vaporization is continuously introduced from the tank 17 through the valve 18 which is shown in FIG. 1. The gas then moves through the bore 11 and through the pipe 9 into the vaporization chamber or antechamber 8.

The discharge pipe 7 provides a gas flow restrictor in the form of an orifice 12 at the end thereof which extends into the chamber 50. When only a very small gas flow into the vaporization chamber 50 is desired for carrying out a particular coating process, it is desirable to use the discharge pipe having the small discharge orifice 12.

The wall 8 defining the antechamber is surrounded by a jacket 8a and means are provided for circulating a cooling medium through the cooling jackets including connections 13 and 14 for the passage of the cooling medium. The pipe 7 is also surrounded by an electrically insulating sleeve 15 and it carries a flange 16 which is flanged vacuum tight on an opening of the base plate 2 of the coating chamber 50 in which the vaporization takes place.

For the reactive vaporization, the reaction gas is continuously introduced into the coating chamber 50 and pumped off from there continuously by means of the pump 6 to such an extent that just the required pressure of the reactive atmosphere is established in the vaporization chamber. If at the same time a high voltage of, for example, 1000 volts is applied to the electrode 9, an electrical gas discharge is formed between the electrode 9 and the holding means 4 which has a ground potential and acts as a counterelectrode. The gas flows through the gas flow restrictor 7 and the ionized gas discharge yields the desired ionization of the reactive gas in the coating chamber 50. It was found that it is generally more advantageous if the electrode in the chamber 54 has a negative potential but an AC voltage can be used where the desired ionization effect appears in the coating chamber 50 at least in one half wave.

With the above described arrangement, there is obtained with voltages of from 0.5 to several kilovolts and with vacuums in the vaporization chamber of from $10^{-3}$ to $10^{-5}$ Torr, discharge current intensities of 100 milliamperes to several amperes.

With the arrangement wherein the articles to be coated are arranged in a first compartment 50 along with the evaporator, and the second compartment 54 is connected to a supply of the gas to be ionized and in which the gas to be ionized is discharged through the restrictor, it is possible to arrange the high voltage electrode 9 completely outside the coating chamber 50 in which the vaporization takes place. In this manner the electrode is arranged in a shielded or screened off housing below the base plate 2 of the chamber 50 in which the vaporization takes place so that there is no risk for the operating crew even when the bell 1 is opened, for example, when the plant is charged with material to be coated.

In another embodiment of the invention, the inner wall of the second chamber 54 can be designed as a high voltage electrode. In this case it must be made of metal and be electrically connected with a high voltage supply line. Such an electrode has a larger surface than the rod electrode 9 and can therefore absorb more electric power of the gas discharge without being excessively heated. In this last mentioned embodiment, the electrode pipe 9 can be eliminated or it may function as a gas inlet into the second chamber. It is advisable to dimension it so that it defines a sufficient high flow resistance through the flow passage for the gas to be introduced into the second chamber from the tank 17 through the valve 18. Since a pressure difference is produced between the second chamber 54 and the valve 18 which has a ground potential and which the second chamber 54 is connected to an electrically insulating pipe line, the risk that the electrical gas discharge in the second chamber 54 will spread through the bore 11 to the inlet valve 18 can thus be eliminated.

Figure 3:
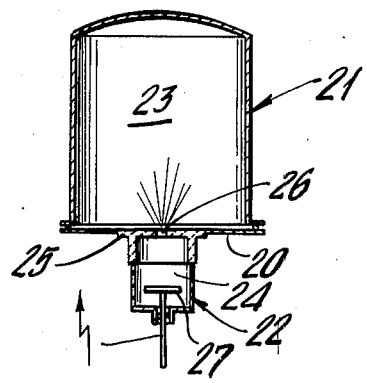
FIG. 3 is a view similar to FIG. 1 but on a reduced scale and of another embodiment of the invention.

In FIG. 3 there is another embodiment of the invention, wherein a first chamber or vaporization chamber 23 is formed within a bell 21 which is connected over a base plate 20. The underside of the base plate 20 is connected to a antechamber or second chamber 24 which is defined within a container 22. The partition between the chamber 23 and the chamber 24 is formed by a plate 25 of an electrically insulating material which is provided with an opening 26 which acts as a gas flow restrictor. The electrode and counterelectrode of the gas discharge can be formed by the wall of the bell 21 or the container 22 and be designed as special built-in electrodes. Such a built-in electrode 27 is shown in FIG. 3. The means for gas inlet, the antechamber, the evaporator and the holding means for the objects to be coated are designed similar to that shown in FIG. 1 but are now shown. The counterelectrode in the vaporization chamber 23 is preferably at ground potential. It is also possible to apply a voltage of such polarity to a counterelectrode which is arranged electrically insulated in the vaporization chamber, for example, to the holding means for the objects to be coated and which is designed as a counterelectrode so that it acts as a positive potential voltage with regard to the ions. When the electrode 27 in the chamber 24 has a negative potential, a positive potential will be used for the holding means for the articles. Such a measure may be of advantage to concentrate the ions on the objects to be coated.

The progress which has been achieved by the invention is probably due to the fact that a substantially higher ionic density is achieved in the range of the objects to be coated in the vaporization chamber 23, 50 then was possible heretofore. This in turn is probably due to the fact that the reactive gas and the vaporization chamber is traversed by the entire discharge current, which can amount to several amperes as mentioned above. This is in contrast to the known arrangements where the discharge between two electrodes takes place in a special gas discharge cell separated from the vaporization chamber, and where only a small part of the ions produced in this discharge can get through an opening in the wall of the cell into the vaporization chamber.

While specific embodiments of the invention have been shown and described in detail to illustrate the application of the principles of the invention, it will be understood that the invention may be embodied otherwise without departing from such principles.

What is claimed is:

1. An arrangement for depositing thin coats by vaporization on substrates under the simultaneous action of an ionized gas, comprising a first housing defining a first gas chamber having an evaporative coating material therein and means defining a counter electrode and a holder for an object to be coated, a second housing including an antechamber portion having a tubular gas discharge electrode therein, a supply line for the gas to be ionized, connected to said gas discharge electrode, a long tubular gas flow restrictor extending from said antechamber to said first chamber and having a first open end aligned with said gas discharge electrode, and an opposite end with an orifice restrictor opening into first chamber, an insulating sleeve surrounding said tubular gas flow restrictor and having flange means connecting said sleeve to said first housing and insulating said tubular gas flow restrictor and said antechamber portion from said first housing, and means to maintain a pressure gradient between said first chamber and said antechamber portion during vaporization, 2. An arrangement according to claim 1, wherein said counter electrode comprises the interior wall of said first housing.

3. An arrangement according to claim 1, wherein said holding means in said first chamber comprises said counter electrode.

4. An apparatus for depositing thin coatings on a substrate by evaporation, comprising a first housing having an interior first chamber, means for supporting an evaporation coating material in said first chamber, a holder for objects to be coated in said first chamber, a second housing defining a second chamber having one end with a passage therethrough and an opposite second end, a reaction gas supply connected to said passage for supplying reaction gas thereto, a high voltage hollow tubular electrode having a first end mounted in said one end of said second chamber in alignment with said passage and having an opposite second end terminating adjacent the opposite end of said second chamber, a tubular connecting line extending through said opposite second end and having an open end opening into said second chamber and an opposite end with a small size restrictor opening communicating with said first chamber, said tubular connecting line being aligned with said electrode to receive gases discharged thereby, and an insulating sleeve covering a portion of said tubular connecting line and being flanged to said first housing and insulating said tubular connecting line from said housing.

* * * * *